(12) United States Patent
Yu et al.

(10) Patent No.: US 8,842,489 B2
(45) Date of Patent: Sep. 23, 2014

(54) FAST-SWITCHING WORD LINE DRIVER

(75) Inventors: Hung-Chang Yu, Hsin-Chu (TW);
Ku-Feng Lin, New Taipei (TW);
Kai-Chun Lin, Hsinchu (TW); Yue-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 183 days.

(21) Appl. No.: 13/447,318

(22) Filed: Apr. 16, 2012

(65) Prior Publication Data

US 2013/0242676 A1 Sep. 19, 2013

Related U.S. Application Data

(60) Provisional application No. 61/611,272, filed on Mar. 15, 2012.

(51) Int. Cl.
*G11C 5/14* (2006.01)

(52) U.S. Cl.
USPC .......................................... 365/226

(58) Field of Classification Search
USPC .................................. 365/189.011
See application file for complete search history.

(56) References Cited

U.S. PATENT DOCUMENTS

| | | | | |
|---|---|---|---|---|
| 7,701,784 B2 * | 4/2010 | Maejima et al. | ......... | 365/189.09 |
| 2007/0047300 A1 * | 3/2007 | Lee et al. | ................. | 365/185.03 |
| 2007/0076487 A1 * | 4/2007 | Takeuchi et al. | ......... | 365/185.22 |
| 2007/0076513 A1 * | 4/2007 | Yang et al. | ............... | 365/230.06 |
| 2008/0205184 A1 * | 8/2008 | Tsukude | ....................... | 365/226 |
| 2010/0149871 A1 * | 6/2010 | Tanaka | ..................... | 365/185.03 |
| 2013/0135941 A1 * | 5/2013 | Reohr et al. | ............ | 365/189.02 |

OTHER PUBLICATIONS

Kim, J.P. et al., "A 45 nm 1 Mb Embedded STT-MRAM with design techniques to minimize read-disturbance", 2011 Symposium on VLSI Circuits Digest of Technical Papers, pp. 296-297.

* cited by examiner

*Primary Examiner* — Huan Hoang
*Assistant Examiner* — Min Huang
(74) *Attorney, Agent, or Firm* — Duane Morris LLP

(57) ABSTRACT

A word line driver of a semiconductor memory includes logic circuitry for coupling a word line to a first node set at a first voltage level when the word line driver is in a first state or to a second node set at a second voltage level when the word line driver is in a second state. A capacitor is configured to be charged to a third voltage level that is greater than the first and second voltage levels. First and second transistors are configured to selectively couple the word line to the capacitor and to a third node set at a fourth voltage level when the word line driver is in a third state. The fourth voltage level is greater than the first voltage level and less than the second voltage level.

21 Claims, 4 Drawing Sheets

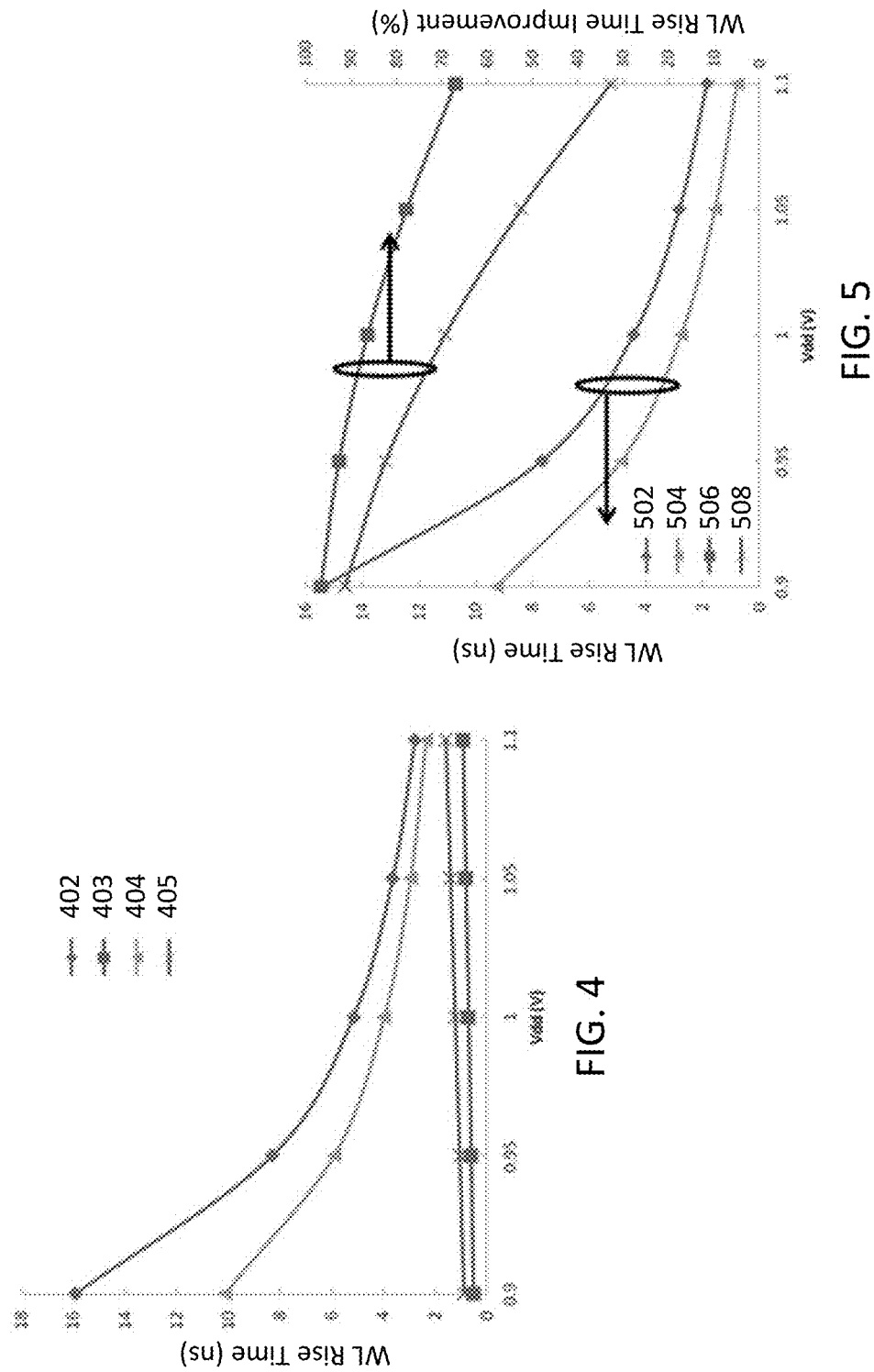

FAST-SWITCHING WORD LINE DRIVER

CROSS-REFERENCE TO RELATED APPLICATIONS

This application claims priority to U.S. Provisional Patent Application No. 61/611,272, filed Mar. 15, 2012, the entirety of which is hereby incorporated by reference.

FIELD OF DISCLOSURE

The disclosed circuit and method relate to semiconductor memories. More particularly, the disclosed circuit and method relate to word line drivers for semiconductor memories.

BACKGROUND

Semiconductor memories, such as SRAMs and DRAMs, include of a plurality of memory bit cells arranged in rows and columns. Each memory bit cell is coupled to at least one bit line, which vertically extends across the memory array, and to at least one word line, which horizontally extends across the memory array. The word lines are used to selectively turn on and off transistors of a memory bit cell during read and write operations.

Word line drivers are circuits coupled to the word lines that drive the word lines to particular voltages during the read/write operations. For example, during a write operation, a word line may be driven to 1.6 volts by a word line driver, and the word line may be driven to 1.1 volts during a read operation. The devices that form the word line drivers are conventionally thick-oxide devices in order to prevent damage to the devices when they are subjected to relatively high voltages during the write operations. However, implementing the devices of the word line drivers as thick-oxide devices results in the devices being under-driven during a read operation. The under-driving of the devices during read operations causes the rising of word lines to be unacceptably slow for high-speed memory applications.

BRIEF DESCRIPTION OF THE DRAWINGS

FIG. 4 is a graph comparing the performance of the improved word line driver to conventional word line drivers for different operating conditions.

FIG. 5 is a graph demonstrating the improvement between the traces shown in FIG. 4.

DETAILED DESCRIPTION

This description of the exemplary embodiments is intended to be read in connection with the accompanying drawings, which are to be considered part of the entire written description.

The disclosed circuit and method advantageously utilize a charge sharing scheme that enables high-speed operation of a semiconductor memory, such as an SRAM, a DRAM, or other memory device including a word line driver, while still avoiding damage when a high voltage, e.g., greater than or equal 1.5 V, is used to drive the word line during a write operation. Additionally, the disclosed circuit and method may be implemented using smaller devices, e.g., capacitors, than the devices used to implement other charge sharing schemes, which advantageously reduces the amount of space on a semiconductor wafer needed to implement the word line drivers.

Figure 1:
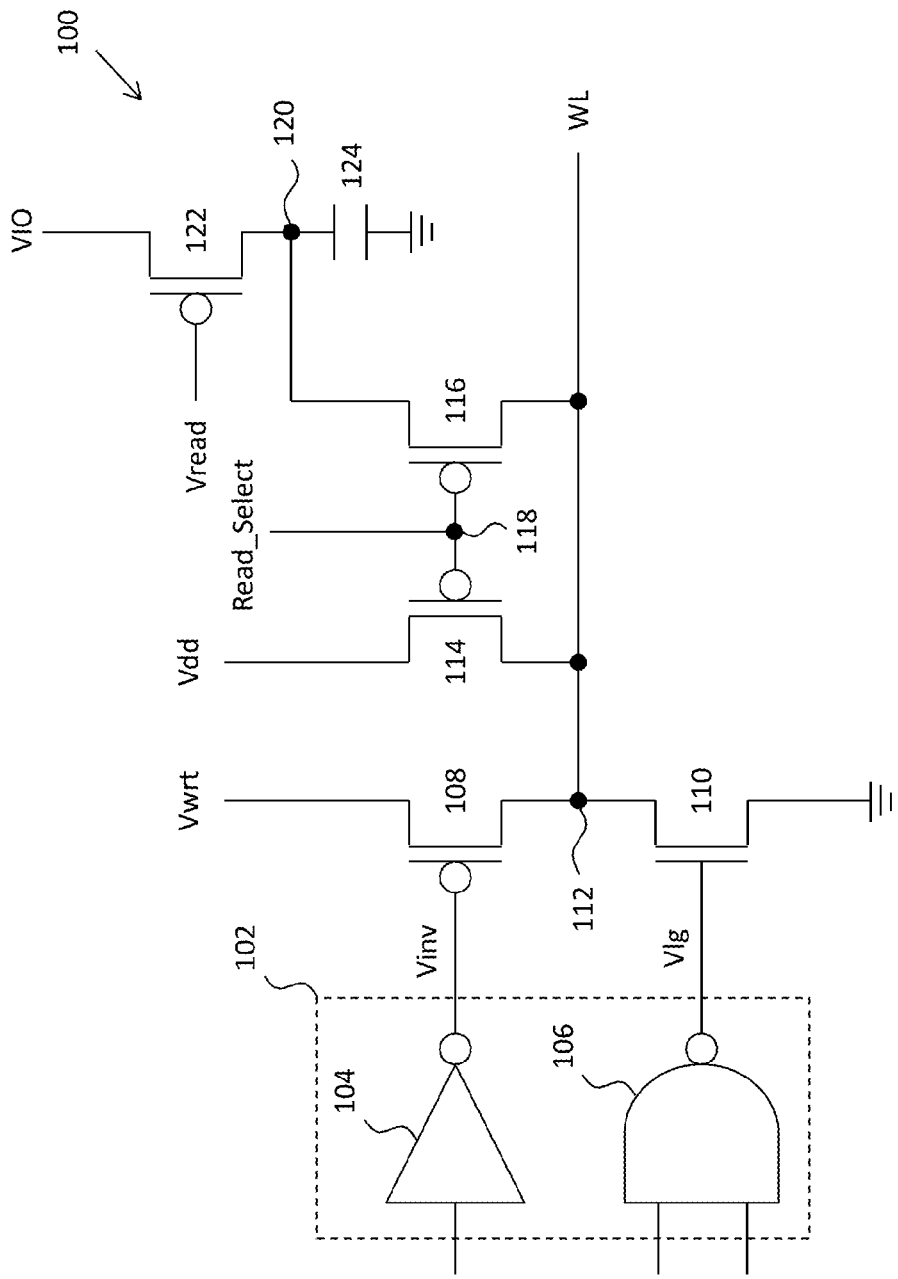
FIG. 1 illustrates one example of a word line driver.

FIG. 1 illustrates one example of an improved word line ("WL") driver 100. As shown in FIG. 1, WL driver 100 includes control circuitry 102 comprising an inverter 104 and a logic gate 106. Inverter 104 has its output coupled to the gate of transistor 108, which has its source coupled to a node for receiving a write voltage, Vwrt, and its drain coupled to the drain of transistor 110 at node 112. Transistor 110 has its source coupled to a node set at the voltage of a low voltage power supply, such as ground or VSS, and its gate is coupled to receive a control signal from logic gate 106. In some embodiments, logic gate 106 is implemented as a NAND gate, transistor 108 is a PMOS transistor, and transistor 110 is an NMOS transistor; however, one of ordinary skill in the art will understand that these device types may be varied.

Node 112 is coupled to the word line, WL, which is also coupled to the drains of transistors 114 and 116, which are illustrated as PMOS transistors. The word line is coupled to a row of memory bit cells of a plurality of rows and columns of bit cells (not shown) in a semiconductor memory. The gates of transistors 114 and 116 are tied together at node 118, which is configured to receive a read select signal, Read_Select, that is asserted during a read operation of the semiconductor memory. The source of transistor 114 is coupled to a node set at the core circuit supply voltage, Vdd, and the source of transistor 116 is coupled to node 120, which is disposed between transistor 122 and capacitor 124. Transistor 122 is illustrated as a PMOS transistor having its drain coupled to node 120, its source coupled to an input/output ("I/O") supply voltage, VIO, and its gate coupled to receive a read signal, Vread. Each of the transistors 108, 110, 114, 116, and 122 is implemented as thick oxide devices through a same or similar process used to fabricate the I/O devices as will be understood by one of ordinary skill in the art.

Figures 2A, 2B:
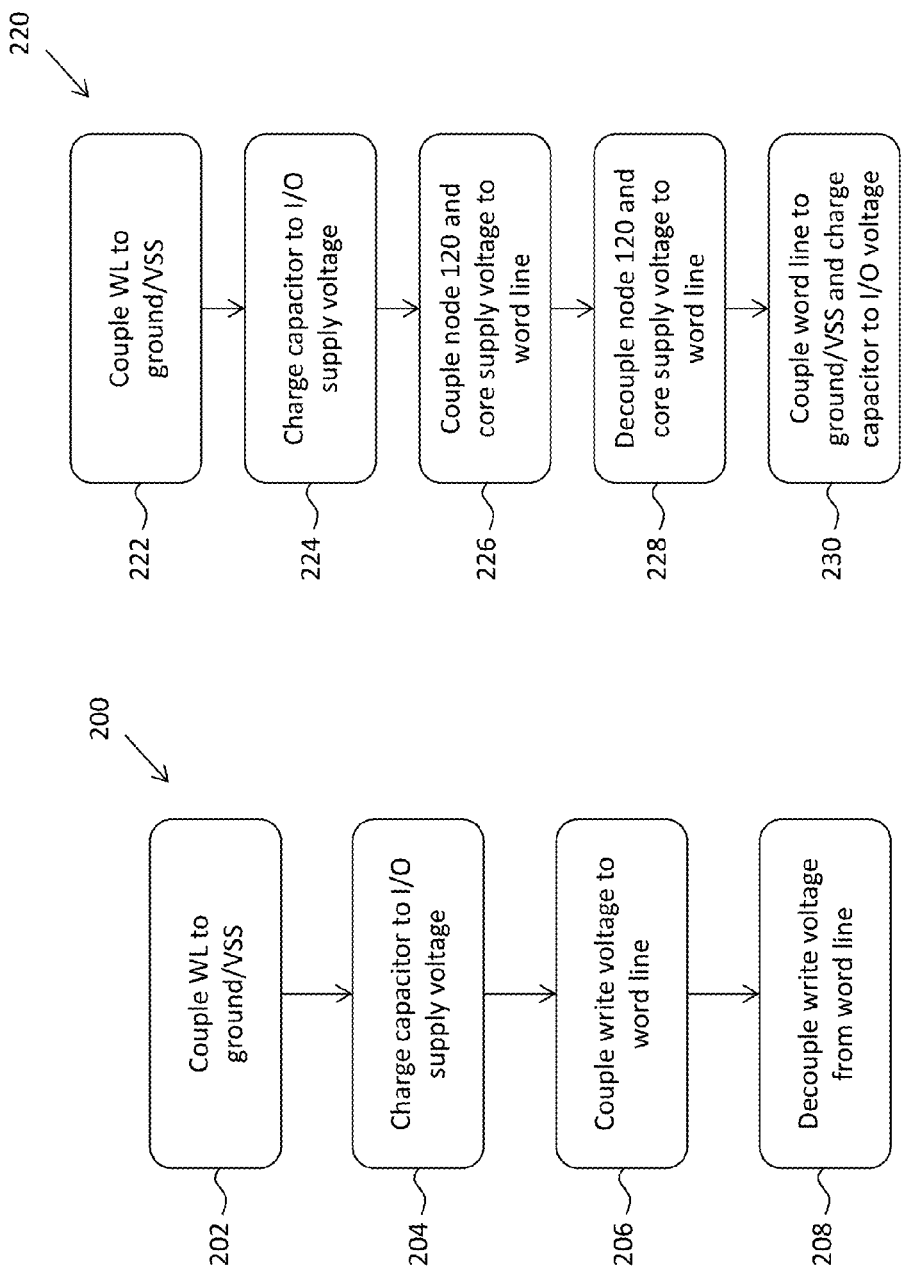
FIG. 2A is a flow diagram of one example of a method of a write operation performed by a word line driver in accordance with FIG. 1.
FIG. 2B is a flow diagram of one example of a method of a read operation performed by a word line driver in accordance with FIG. 1.
Figure 3:
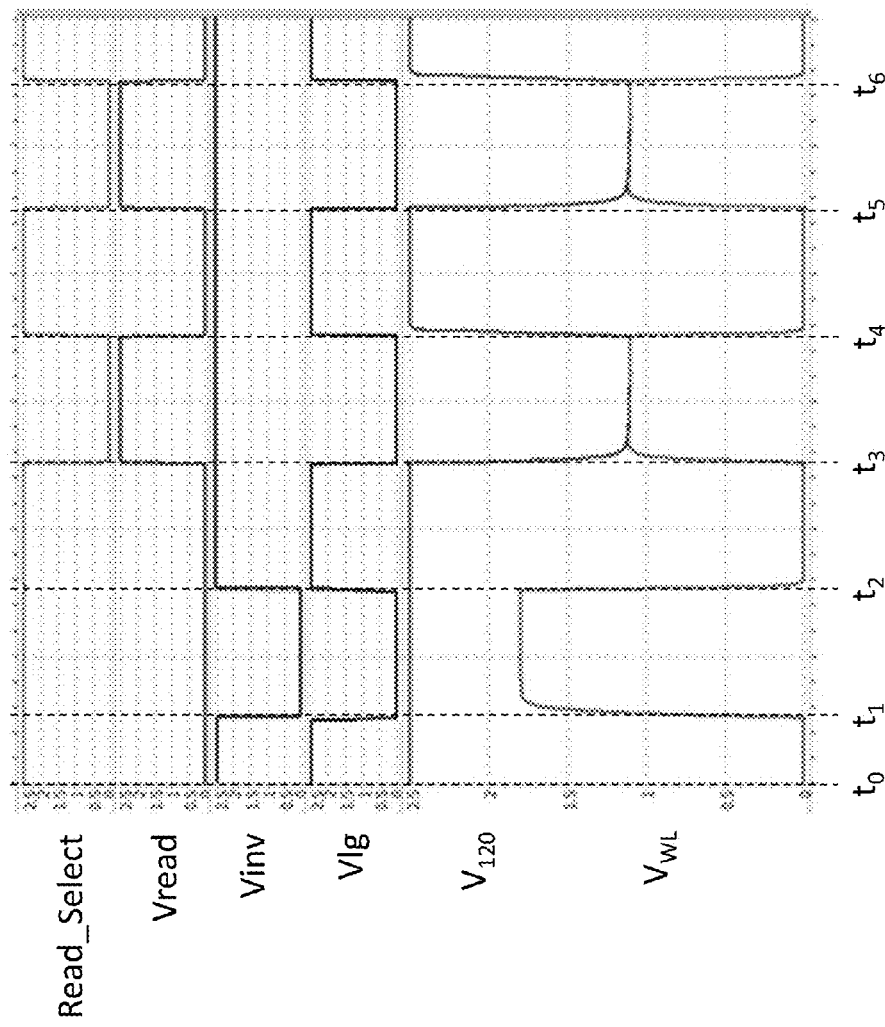
FIG. 3 is a graph illustrating various signals of a word line driver in accordance with FIG. 1 during a simulation.

The operation of word line driver 100 during a write operation is described with references to FIGS. 1, 2A, and 3 in which FIG. 2A is a flow diagram of one example of a method 200 of performing a write operation. At block 202, the word line is coupled to ground or VSS such that the voltage on the word line is discharged. The word line is coupled to ground or VSS through transistor 110, which is in a current-conducting 'on' state. Transistor 110 is turned on in response to receiving a logic one signal from logic gate 106, Vlg.

The write voltage supply, Vwrt, core circuit power supply, Vdd, and voltage at node 120 are isolated from the word line as transistors 108, 114, and 116 are in non-current-conducting 'off' states. Transistor 108 is turned off in response to inverter 106 outputting a voltage, Vinv, corresponding to a logic one signal. Transistors 114 and 116 are turned off in response to the Read_Select signal being a logic one.

At block 204, capacitor 124 is charged to the voltage of the input/output ("I/O") supply voltage, VIO. To charge capacitor 124 to VIO, transistor 122 is turned on by the Vread signal, which is received at the gate of transistor 122, being a logic zero. Since transistor 116 is in an off state, current flows through transistor 122 where it builds up on one of the plates of capacitor 124, which has its other plate coupled ground or VSS. As will be understood by one of ordinary skill in the art, blocks 202 and 204 may be simultaneously performed.

For example, blocks 202 and 204 are performed between times $t_0$ and $t_1$ in FIG. 3. As shown in FIG. 3, the Read_Select, Vinv, and Vlg, signals are at 2.5 volts, which corresponds to a logic one in the simulation, between times $t_0$ and $t_1$. The voltage at node 120, $V_{120}$, which corresponds to the voltage on capacitor 124, is also at a voltage of 2.5 volts between times $t_0$ and $t_1$. This initial state between times $t_0$ and $t_1$ in FIG. 3 is sometimes referred to herein as a standby state in which writing and reading operations are not being performed.

At block 206, the write operation commences with the outputs of inverter 104 and logic gate 105, Vinv and Vlg, transitioning from logic one to logic zero to couple the write voltage, Vwrt, to the word line. As shown in FIG. 3, Vinv and Vlg transition from a logic one to a logic zero at time $t_1$ at which time the word line voltage increases from zero volts to the voltage of Vwrt, which is set at 1.8 volts in this simulation.

At block 208, the write operation concludes when the write voltage, Vwrt, is decoupled from the word line and recoupled to ground or VSS. The word line is decoupled from the write voltage, Vwrt, by transistor 108 transitioning from an on state to an off state in response to the voltage output from inverter 104, Vinv, transitioning from a logic one to a logic zero. The decoupling of the word line from ground or VSS occurs in response to the output of logic gate 106, Vlg, transitioning from a logic one to a logic zero, which turns off transistor 110.

The transitioning of the signals at the end of the write operation is shown in FIG. 3 at time $t_2$. As shown in FIG. 3, the write operation extends between times $t_1$ and $t_2$ as the word line voltage, $V_{WL}$, is pulled up to approximately 1.8 volts, which is the voltage used for Vwrt for the simulation. At time $t_2$, the voltage on the word line transitions from 1.8 volts to zero volts as the write operation concludes. In some embodiments, after a write operation concludes the word line driver transitions back to a standby state in which writing and reading operations are not being performed such as, for example, between times $t_2$ and $t_3$ in FIG. 3.

The operation of word line driver 100 during a reading operation is described with references to FIGS. 1, 2B, and 3 in which FIG. 2B is a flow diagram of one example of a method 220 of performing a read operation. At block 222, the word line is coupled to ground or VSS such that the voltage on the word line is discharged. The word line is coupled to ground or VSS through transistor 110, which is on. Transistor 110 is turned on in response to receiving a logic one signal from logic gate 106, Vlg. The pre-read operation state of block 222 is shown between times $t_2$ and $t_3$ in FIG. 3.

At block 224, capacitor 124 is charged to the voltage of the I/O supply voltage, VIO. To charge capacitor 124 to VIO, transistor 122 is turned on by the Vread signal being a logic zero and being received at the gate of transistor 122. Since transistor 116 is off, current flows through transistor 122 where it builds up on one of the plates of capacitor 124, which has its other plate coupled ground or VSS. As will be understood by one of ordinary skill in the art, blocks 222 and 224 may be simultaneously performed during a standby state of the word line driver 100.

At block 226, the voltage at node 120 and the core supply voltage, Vdd, are coupled to the word line. For example and as illustrated at time $t_3$ in FIG. 3, the Read_Select signal transitions from a logic one to a logic zero, which results in transistors 114 and 116 turning on. In the simulation illustrated in FIG. 3, the voltage of VIO was set at 2.5 volts, which pulls up the voltage of the word line as current flows from node 120 to the word line. The core supply voltage, Vdd, was set at 1.2 volts, which where the word line voltage, $V_{WL}$, levels off.

The voltage at node 120 advantageously pulls-up the voltage on the word line faster than if the core supply voltage, Vdd, was the only voltage source pulling up the word line voltage. The charge stored on capacitor 124 flows from node 120 to the word line since transistor 122 is turned off in response to the Vread signal being a logic one at time $t_3$. Additional current is supplied to the word line from the core voltage supply, Vdd, through transistor 114. The speed at which the word line increases from zero volts (e.g., ground or VSS) to the core supply voltage level is increased by the discharging of capacitor 124.

Also at time $t_3$, the output of logic gate 106, Vlg, transitions from a logic one to a logic zero, which decouples the word line from VSS/ground. The output of inverter 104, Vinv, maintains its voltage level as a logic one such that transistor 108 remains in an off state. With transistors 108 and 110 off, the word line is not coupled to the write voltage supply, Vwrt, or to ground or VSS. The read operation continues between times $t_3$ and $t_4$.

At block 228, the read operation concludes as the node 120 and core supply voltage, Vdd, are decoupled from the word line. The decoupling of node 120 and core supply voltage, Vdd, from the word line occurs in response to the Read_Select signal transitioning from a logic zero to a logic one, which is shown in at time $t_4$ in FIG. 3. The transitioning of the Read_Select signal from a logic zero to a logic one turns off transistors 114 and 116 such that the word line is decoupled from Vdd and node 120.

At block 230, which can be performed simultaneously with block 228, the word line is coupled to ground or VSS and capacitor 124 is charged by the I/O supply voltage, VIO. Referring again to FIG. 3, the Vread signal transitions from a logic one to a logic zero at time $t_4$, which results in transistor 122 turning on. With transistor 122 on and transistor 116 off, the I/O supply voltage is coupled to node 120 such that capacitor 124 is charged. Also at time $t_4$, the output of logic gate 106, Vlg, transistors from a logic zero to a logic one, which turns on transistor 110 such that the word line is coupled to ground or VSS through transistor 110.

One of ordinary skill in the art will understand that the writing and reading operations described above with respect to FIGS. 2A and 2B may be repeated and performed in different orders. As shown in FIG. 3, another read operation is performed between times $t_5$ and $t_6$, which follows the same flow as described above with respect to FIG. 2B.

FIGS. 4 and 5 are graphs demonstrating the improved rise time provided by word line drivers described above. Referring first to FIG. 4, four traces are shown with two traces, 402, 404, corresponding to a conventional word line driver and two traces, 403, 405 corresponding to a word line driver in accordance with the driver 100 illustrated in FIG. 1. The traces in FIG. 4 were obtained by simulating the performance for the slow-slow ("SS") processing corner. Traces 402 and 403 correspond to simulations performed in which the I/O source voltage, VIO, was set at 2.5 volts, and traces 404, 405 correspond to simulations performed in which VIO was set at 2.25 volts. As shown in FIG. 4, the word line rise times for the word line couples to the word line drivers disclosed herein are faster than the word lines couples to conventional word line drivers especially for lower core voltages, Vdd. FIG. 4 also demonstrates that the rise time of the word lie is improved as the I/O supply voltage is increased.

Turning now to FIG. 5, two of the traces 502, 504 plot the improvement provided by the improved drivers described herein in nanoseconds, and two of the traces 506, 508 plot the improvement provided by the word line drivers described herein. For example, trace 502 corresponds to the difference between traces 402 and 403 (i.e., 502=402-403) in FIG. 4, and trace 504 corresponds to the difference between traces 404 and 405 (i.e., 504=404-405) in FIG. 4. Traces 506 demonstrates the percent improvement provided by the improved word line driver when VIO=2.5 volts. For example, the values of trace 506 may be calculated as: 506=(402-403)/402× 100%. Similarly, the values of trace 508 may be calculated as: 508=(404-405)/404×100%.

Not only does the word line driver provide improved performance, but the sizes of the word line driver may be selected to minimize size. For example, the total charge, Q, stored by a capacitor having a capacitance, C, is based on the voltage, V, applied the capacitor, i.e., Q=CV, as will be understood by one of ordinary skill in the art. By supplying capacitor 124 with a voltage, VIO, that is greater than both the write voltage, Vwrt, and the core supply voltage, Vdd, the size of the capacitor may be made small. Although the capacitor 124 is described above as being charged by the I/O supply voltage, other voltage supplies may be used including power supplies having voltages that are less than, equal to, or greater than the write supply voltage, Vwrt.

In some embodiments, a word line driver of a semiconductor memory includes logic circuitry for coupling a word line to a first node set at a first voltage level when the word line driver is in a first state or to a second node set at a second voltage level when the word line driver is in a second state. A capacitor is configured to be charged to a third voltage level that is greater than the first and second voltage levels. First and second transistors are configured to selectively couple the word line to the capacitor and to a third node set at a fourth voltage level when the word line driver is in a third state. The fourth voltage level is greater than the first voltage level and less than the second voltage level.

In some embodiments, a method includes charging a capacitor to a first voltage level, performing a first operation of a first type, and performing a first operation of a second type. Performing the first operation of the first type includes driving a word line from a second voltage level to a third voltage level and discharging the word line from the third voltage level to the second voltage level. The third voltage level is greater than the second voltage level. Performing the first operation of the second type includes coupling the capacitor to the word line to increase a voltage level of the word line, maintaining the word line at a fourth voltage level, and discharging the word line from the fourth voltage level to the second voltage level. The fourth voltage level is greater than the second voltage level and less than the third voltage level.

In some embodiments, a word line driver for a semiconductor memory includes a first transistor having a source coupled to a first voltage supply set at a first voltage level and a drain coupled to a word line. The first transistor is configured to couple the first voltage supply to the word line when the word line driver is in a first state. A second transistor has a source coupled to a second voltage supply set at a second voltage level and a drain coupled to the word line. The second voltage level is greater than the first voltage level. The second transistor is configured to couple the second voltage supply to the word line when the word line driver is in a second state. A third transistor has a source coupled to a third voltage supply set at a third voltage level and a drain coupled to the word line. The third voltage level is greater than the first voltage level and less than the third voltage level. A fourth transistor has a source coupled to a capacitor and a drain coupled to the word line. The capacitor is configured to be charged to a fourth voltage level by a fourth voltage supply. The third and fourth transistors are configured to couple the capacitor and the third voltage supply to the word line when the word line driver is in a third state.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A word line driver of a semiconductor memory, comprising:
   logic circuitry for coupling a word line to a first node set at a first voltage level when the word line driver is in a first state or to a second node set at a second voltage level when the word line driver is in a second state;
   a capacitor configured to be charged to a third voltage level that is greater than the first and second voltage levels; and
   first and second transistors for selectively coupling the word line to the capacitor and to a third node set at a fourth voltage level when the word line driver is in a third state,
   wherein the fourth voltage level is greater than the first voltage level and less than the second voltage level.

2. The word line driver of claim 1, wherein the first state is a standby state in which read and write operations are not being performed, and the second state is a write state.

3. The word line driver of claim 2, wherein the third state is a read state.

4. The word line driver of claim 1, wherein the first voltage level is set at ground and the fourth voltage level is set at an operating voltage level for core devices of the semiconductor memory.

5. The word line driver of claim 4, wherein the third voltage level is an operating voltage level for input/output circuitry of the semiconductor memory.

6. The word line driver of claim 1, wherein the first and second transistors have their gates coupled together and to receive a first control signal.

7. The word line driver of claim 6, further comprising a third transistor having a source coupled to a fourth node set at the third voltage level, a drain coupled to a fifth node to which the capacitor and the second transistor are coupled, and a gate configured to receive a second control signal.

8. The word line driver of claim 1, wherein the logic circuitry is coupled to third and fourth transistors, the third and fourth transistors having their drains coupled together and to the word line.

9. The word line driver of claim 8, further comprising a fifth transistor having a source coupled to a fourth node set at the third voltage level, a drain coupled to a fifth node to which the capacitor and the second transistor are coupled, and a gate configured to receive a second control signal.

10. A method, comprising
    charging a capacitor to a first voltage level;
    performing a first operation of a first type, the first operation of the first type including
        driving a word line from a second voltage level to a third voltage level, the third voltage level being greater than the second voltage level, and the first voltage level being greater than the third voltage level, and
        discharging the word line from the third voltage level to the second voltage level; and
    performing a first operation of a second type, the first operation of the second type including
        coupling the capacitor to the word line to increase a voltage level of the word line, maintaining the word line at a fourth voltage level, the fourth voltage level being greater than the second voltage level and less than the third voltage level, and discharging the word line from the fourth voltage level to the second voltage level.

11. The method of claim 10, wherein the first operation of the first type is a writing operation, and the first operation of the second type is a read operation.

12. The method of claim 10, wherein driving the word line from the second voltage level to the third voltage level includes
decoupling the word line from a first voltage supply set at the second voltage level, and
coupling the word line to a second voltage supply set at the third voltage level.

13. The method of claim 12, wherein discharging the word line from the third voltage level to the second voltage level includes
decoupling the word line from the second voltage supply, and
coupling the word line to the first voltage supply.

14. The method of claim 10, wherein maintaining the word line at the fourth voltage level includes
decoupling the word line from a first voltage supply set at the second voltage level, and
coupling the word line to a second voltage supply set at the fourth voltage level.

15. The method of claim 14, wherein discharging the word line from the fourth voltage level to the second voltage level includes
decoupling the word line from the second voltage supply, and
coupling the word line to the first voltage supply.

16. The method of claim 10, wherein
the first voltage level is an operating voltage for input/output circuitry,
the second voltage level is a low voltage supply level for core circuitry, and
the fourth voltage level is an operating voltage for core circuitry.

17. A word line driver for a semiconductor memory, comprising:
a first transistor having a source coupled to a first voltage supply set at a first voltage level and a drain coupled to a word line, the first transistor configured to couple the first voltage supply to the word line when the word line driver is in a first state;
a second transistor having a source coupled to a second voltage supply set at a second voltage level and a drain coupled to the word line, the second voltage level being greater than the first voltage level, the second transistor configured to couple the second voltage supply to the word line when the word line driver is in a second state;
a third transistor having a source coupled to a third voltage supply set at a third voltage level and a drain coupled to the word line, the third voltage level being greater than the first voltage level and less than the third voltage level; and
a fourth transistor having a source coupled to a capacitor and a drain coupled to the word line, the capacitor configured to be charged to a fourth voltage level by a fourth voltage supply,
wherein the third and fourth transistors are configured to couple the capacitor and the third voltage supply to the word line when the word line driver is in a third state.

18. The word line driver of claim 17, further comprising:
logic circuitry coupled to gates of the first and second transistors, the logic circuitry configured to output signals to the gates for selectively coupling the first and second voltage sources to the word line; and
a fifth transistor having a source coupled to the fourth voltage supply and a drain coupled to the capacitor, the fifth transistor configured to selectively couple the fourth voltage supply to the capacitor for charging the capacitor to the fourth voltage level.

19. The word line driver of claim 17, wherein the first voltage level is ground, the third voltage level is an operating voltage of core devices of the semiconductor memory, and the fourth voltage level is an operating voltage of input/output devices of the semiconductor memory.

20. A method, comprising
charging a capacitor to a first voltage level;
performing a first operation of a first type, the first operation of the first type including
decoupling the word line from a first voltage supply set at the second voltage level,
coupling the word line to a second voltage supply set at the third voltage level to drive the word line from the second voltage level to the third voltage level,
decoupling the word line from the second voltage supply, and
coupling the word line to the first voltage supply to discharge the word line from the third voltage level to the second voltage level; and
performing a first operation of a second type, the first operation of the second type including
coupling the capacitor to the word line to increase a voltage level of the word line,
maintaining the word line at a fourth voltage level, the fourth voltage level being greater than the second voltage level and less than the third voltage level, and
discharging the word line from the fourth voltage level to the second voltage level.

21. A method, comprising:
charging a capacitor to a first voltage level;
performing a first operation of a first type, the first operation of the first type including
driving a word line from a second voltage level to a third voltage level, the third voltage level being greater than the second voltage level, and
discharging the word line from the third voltage level to the second voltage level; and
performing a first operation of a second type, the first operation of the second type including
coupling the capacitor to the word line to increase a voltage level of the word line,
maintaining the word line at a fourth voltage level, the fourth voltage level being greater than the second voltage level and less than the third voltage level, wherein maintaining the word line at the fourth voltage level includes
decoupling the word line from a first voltage supply set at the second voltage level, and
coupling the word line to a second voltage supply set at the fourth voltage level; and
discharging the word line from the fourth voltage level to the second voltage level, wherein discharging the word line from the fourth voltage level to the second voltage level includes
decoupling the word line from the second voltage supply, and
coupling the word line to the first voltage supply.

* * * * *